(12) United States Patent
Huang et al.

(10) Patent No.: US 6,277,667 B1
(45) Date of Patent: Aug. 21, 2001

(54) METHOD FOR FABRICATING SOLAR CELLS

(75) Inventors: Chorng-Jye Huang, Tainan Hsien; Cheng-Ting Chen, Taipei Hsien; Chien-sheng Huang; Lee-Ching Kuo, both of Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/391,257

(22) Filed: Sep. 7, 1999

(51) Int. Cl.[7] .................................................. H01L 21/00
(52) U.S. Cl. ............................ 438/57; 438/549; 438/69; 438/72
(58) Field of Search ................................ 438/69, 71, 72, 438/57, 549; 136/255, 89, 256

(56) References Cited

U.S. PATENT DOCUMENTS 4,131,488 * 12/1978 Lesk et al. ............................ 148/1.5
4,758,525 * 7/1988 Kida et al. ............................... 437/2
5,928,438 * 7/1999 Salami et al. ........................ 136/255

* cited by examiner

Primary Examiner—Matthew Smith
Assistant Examiner—Renzo N. Rocchegiani
(74) Attorney, Agent, or Firm—Ladas & Parry

(57) ABSTRACT

This invention discloses a novel method for fabricating solar cells. Using the existing screen-printing, masking or photo-lithography techniques, a P-type or N-type diffusion source is coated on the sites of an N-type or P-type silicon wafer desired for forming electrodes. Then, a low dose P-type or N-type diffusion source is in situ diffused into the N-type or P-type silicon wafer together with the P-type or N-type diffusion source coated on the N-type or P-type silicon wafer in the furnace. Thereafter, a $P^-/P^+$ or $N^-/N^+$ diffusion region is formed within the N-type or P-type silicon wafer. Finally, electrodes aligned to the $P^+$ or $N^+$ diffusion region are formed by means of screen-printing. Then, a solar cell with high photocurrent and low series resistance can be obtained.

34 Claims, 4 Drawing Sheets

METHOD FOR FABRICATING SOLAR CELLS

FIELD OF THE INVENTION

The invention relates to a method for fabricating solar cells, and in particular to a method for fabricating novel solar cells with low series resistance and enhanced photocurrent.

BACKGROUND OF THE INVENTION

Semiconductor solar cells can transduce light energy into electric energy. Generally speaking, the silicon solar cell consists of a P-N junction. When the photons in sunlight strike the surface of the semiconductor, electron-hole pairs will be induced by high-energy photons. The electron-hole pairs will move to the junction of the semiconductor and produce photocurrent within the loaded semiconductor.

Conventionally, solar cells are fabricated by doping the P-type silicon wafer with concentrated phosphorous to form an $N^+$ diffusion region in the surface of the P-type silicon wafer. Then, electrodes are formed by means of screen-printing. The conventional method for fabricating solar cells will be illustrated in FIGS. 1A~1D.

CONVENTIONAL EXAMPLE

Referring to FIG. 1A, a P-type silicon wafer 10 with a front-side 10A and a backside 10B was provided. Then, the P-type silicon wafer 10 was washed or etched by using acidic or basic solvent (e.g. HF or KOH) to form a rough surface as shown in FIG. 1A-1. The rough front-side 10A can reduce the reflection of incident sunlight. Then, an N-type diffusion region was formed by diffusing N-type impurities (e.g. phosphorous or arsenic) into the front-side 10A of the p-type silicon wafer. The diffusion can be performed by means of furnace diffusion, screen-printing, spin-on or spray.

Referring to FIG. 1B, an anti-reflection coating layer (ARC layer) 14 was formed on the front-side 10A of the P-type silicon wafer by evaporating or vapor deposition. The ARC layer consisted of titanium oxide, tantalum oxide, titanium nitride and so on.

Referring to FIG. 1C, a conductive paste (e.g. silver paste) was printed onto the front-side 10A and backside 10B of the P-type silicon wafer 10. Then, electrodes 16A and 16B were respectively formed on the front-side 10A and backside 10B of the P-type silicon wafer 10.

Referring to FIG. 1D, the product as shown in FIG. 1C as transferred to a furnace (e.g. IR-furnace) with a temperature ranging from 500° C. to 1200° C. to sinter the electrodes 16A and 16B. The electrode 16A overlying the ARC layer 14 passed-through the ARC layer 14 after sintering, and contacted to the N-type diffusion region 12. Thereafter, a solar cell 100 was obtained.

However, the N-type diffusion region 12 is a single-depth junction, thus the conversion efficiency of the solar cell from sunlight to photocurrent is not ideal, and the series resistance of electrodes is high. Consequently, it is hard to enhance the conversion efficiency of the solar cell to 15.5% according to this conventional process.

SUMMARY OF THE INVENTION

This invention discloses a novel method for fabricating solar cells. Using the existing screen-printing, masking or photolithography techniques, a P-type or N-type diffusion source is coated on the sites of an N-type or P-type silicon wafer desired for forming electrodes. Then, a low dose P-type or N-type diffusion source is in situ diffused into the N-type or P-type silicon wafer together with the P-type or N-type diffusion source coated on the N-type or P-type silicon wafer in the furnace. Thereafter, a $P^-/P^+$ or $N^-/N^+$ diffusion region is formed within the N-type or P-type silicon wafer. Finally, electrodes aligned to the $P^+$ or $N^+$ diffusion region are formed by means of screen-printing. Then, a solar cell with high photocurrent and low series resistance can be obtained.

DETAILED DESCRIPTION OF THE DRAWINGS

This invention relates to a method for fabricating solar cells, and particularly to a method for fabricating novel solar cells with low series resistance and enhanced photocurrent.

First, a P-type silicon wafer with a front-side and a backside is provided. Then, the P-type silicon wafer is washed or etched by using acidic or basic solvent (e.g. HF or KOH) to form a rough surface. The rough front-side can reduce the reflection of incident sunlight.

Next, an $N^+$ diffusion source is selectively formed on the front-side of the P-type silicon wafer by screen-printing.

Next, an $N^-$ diffusion source (e.g. $POCl_3$) is diffused into the P-type silicon wafer through the front-side together with the $N^+$ diffusion source overlying the front-side to form an N-type diffusion region consisting of a shallow $N^-$ diffusion region and a deep $N^+$ diffusion region, wherein the deep $N^+$ diffusion region is located under the $N^+$ diffusion source. Moreover, the impurity concentration of the $N^-$ diffusion region ranges from $10^{17}$~$10^{19}$ atoms/$cm^3$, and the impurity concentration of the $N^+$ diffusion region is larger than $10^{20}$ atoms/$cm^3$. Accordingly, the surface resistivity of the $N^-$ diffusion region can reach 100Ω/□, and the surface resistivity of the $N^+$ diffusion region can reach 5~50Ω/□.

Next, the $N^+$ diffusion source is removed by hydrogen fluoride. Then, an anti-reflection layer is formed on the front-side 20A by means of evaporation (e.g. e-beam evaporation) or vapor deposition (e.g. chemical vapor deposition). The anti-reflection layer consists of titanium oxide, tantalum oxide or titanium nitride.

Then, a conductive paste used for forming electrodes is selectively printed on the ARC layer and the backside of the P-type silicon wafer, wherein the electrodes on the ARC layer and electrodes on the backside of the P-type silicon wafer are aligned to the deep $N^+$ diffusion region.

Finally, the product obtained in the previous step is transferred to a furnace (e.g. IR-furnace) with a temperature ranging from 500° C. to 1200° C. to fire for 0.2~2 minutes. Thereafter, a solar cell with low series resistivity and high photocurrent can be obtained.

It is noted that the solar cell described above consists of a P-type silicon wafer and a N-type diffusion region comprising of a shallow $N^-$ diffusion region and a deep $N^+$ diffusion region and electrodes. Alternatively, a solar cell consisting of an N-type silicon wafer and a P-type diffusion region comprising of a shallow P- diffusion region and a deep $P^+$ diffusion region and electrodes can also be fabricated according to this invention.

Embodiment

Figure 1A:
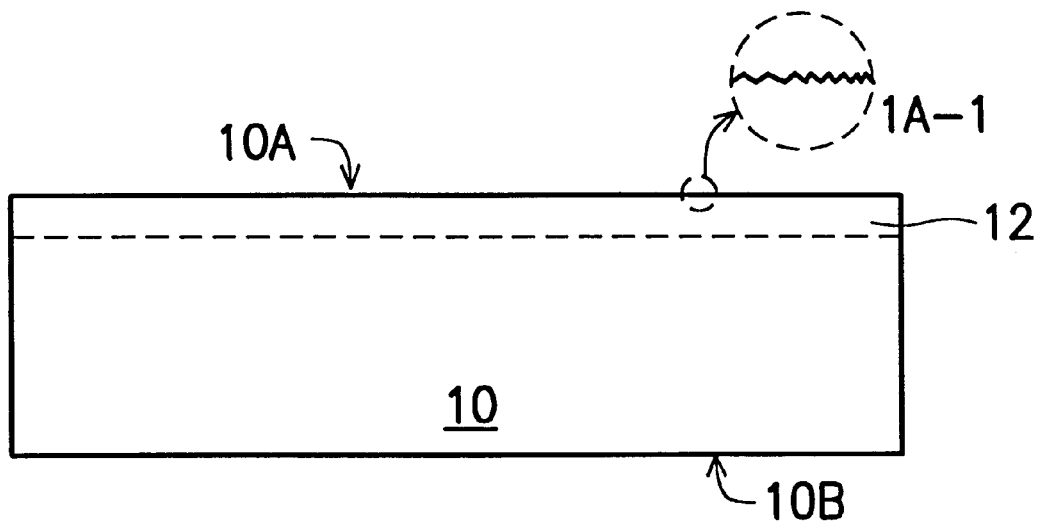
FIGS. 1A~1D are cross-section views of a conventional process for fabricating the solar cell.
Figure 1B:
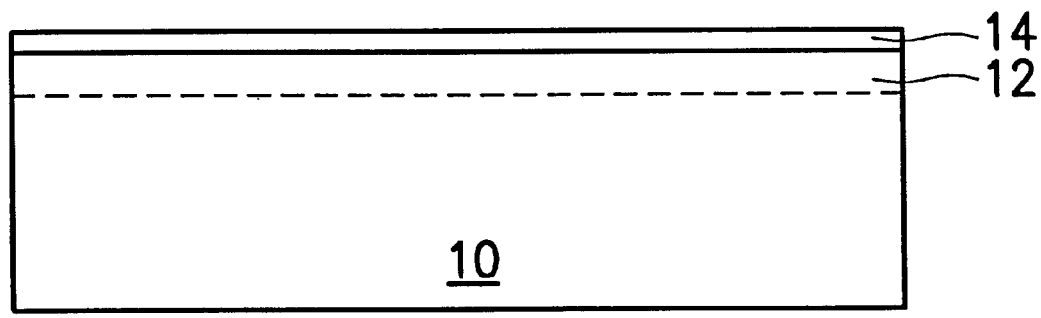
Figure 1C:
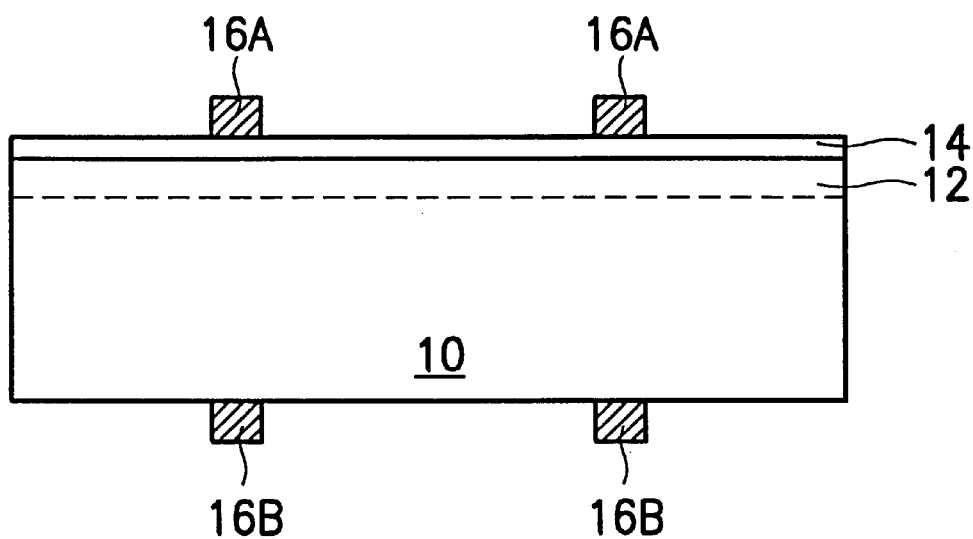
Figure 1D:
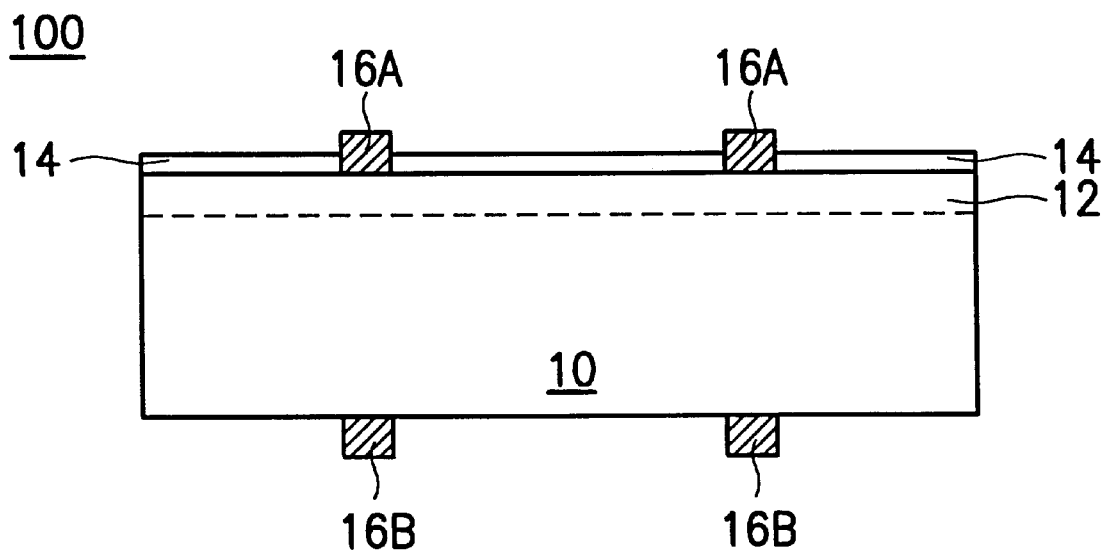
Figure 2A:
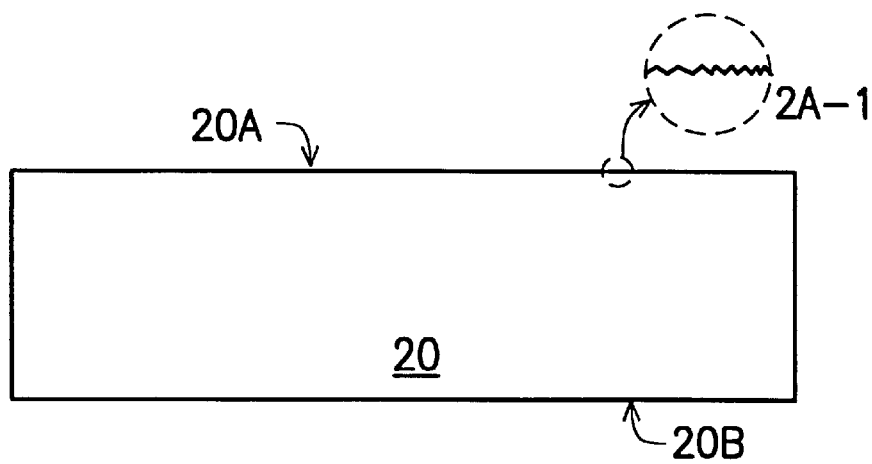
FIGS. 2A~2F are cross-section views of a process for fabricating the solar cell according to one embodiment of this invention.

Referring to FIG. 2A, a P-type silicon wafer 20 with a front-side 20A and a backside 20B was provided. Then, the P-type silicon wafer 20 was washed or etched by using acidic or basic solvent (e.g. HF or KOH) to form a rough surface as shown in detail 2A-1. The rough front-side 20A reduces the reflection of incident sunlight.

Figure 2B:
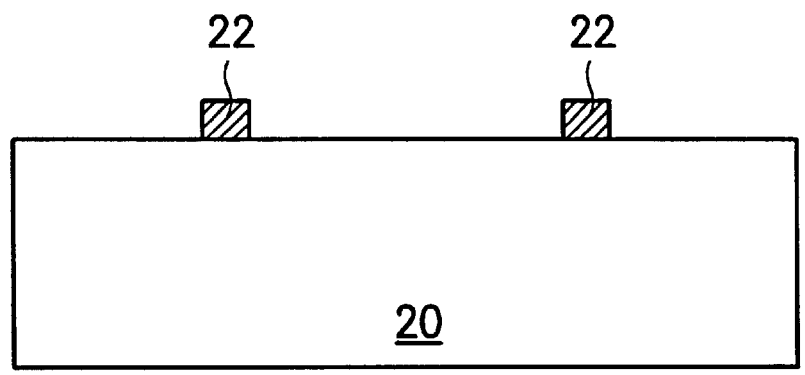

Referring to FIG. 2B, a 0.1~20% phosphorous paste 22 used as an $N^+$ diffusion source was selectively formed on the front-side 20A of the P-type silicon wafer 20 by screen-printing.

Figure 2C:
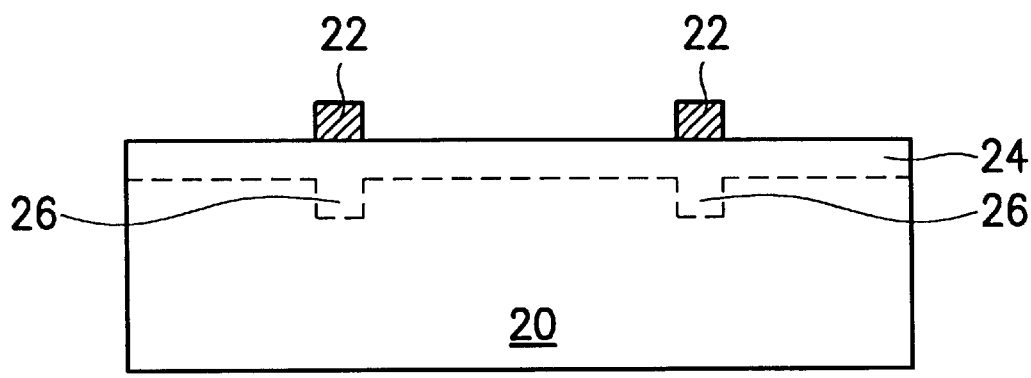

Referring to FIG. 2C, the $N^-$ diffusion source (e.g. $POCl_3$) were diffused into the P-type silicon wafer through the front-side 20A together with the phosphorus paste 22 overlying the front-side 20A to form a shallow $N^-$ diffusion region 24 and a deep $N^+$ diffusion region 26, wherein the deep $N^+$ diffusion region 26 was located under the phosphorous paste 22. Moreover, the impurity concentration of the $N^-$ diffusion region 24 ranged from $10^{17}10^{19}$ atoms/cm$^3$, and the impurity concentration of the $N^+$ diffusion region 26 was larger than $10^{20}$ atoms/cm$^3$.

Accordingly, the surface resistivity of the $N^-$ diffusion region 24 reached 100Ω/□, and the surface resistivity of the $N^+$ diffusion region 26 reached 5~50Ω/□.

Figure 2D:
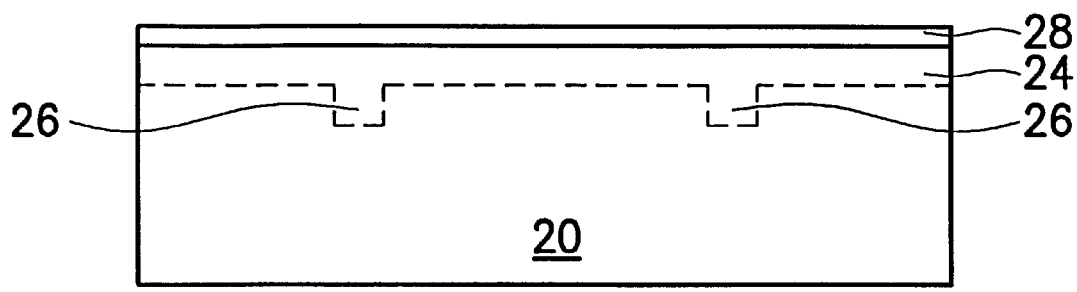

Referring to FIG. 2D, the phosphorous paste 22 was removed by hydrogen fluoride. Then, an anti-reflection layer 28 was formed on the front-side 20A by means of evaporation (e.g. e-beam evaporation) or vapor deposition (e.g. chemical vapor deposition). The anti-reflection layer consists of titanium oxide, tantalum oxide or titanium nitride.

Figure 2E:
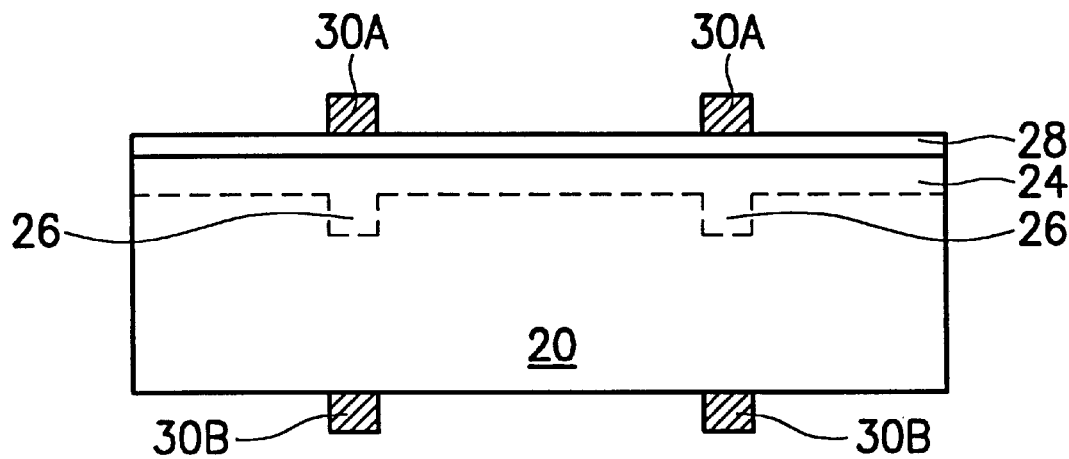

Referring to FIG. 2E, a conductive paste used for forming electrodes was printed on the ARC layer 28 and the backside 20B of the P-type silicon wafer. Subsequently, electrodes 30A on the ARC layer 28 and electrode 30B on the backside 20B of the P-type silicon wafer aligned to the deep $N^+$ diffusion region 26 were obtained.

Figure 2F:
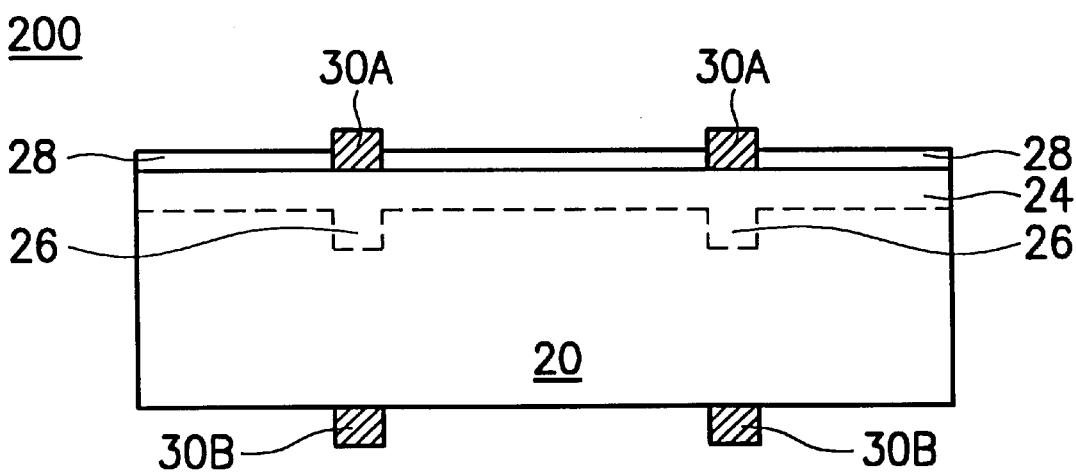

Referring to FIG. 2F, the product as shown in FIG. 2D was transferred to a furnace (e.g. IR-furnace) with a temperature ranging from 500° C. to 1200° C. to fire for 0.2~2 minutes. Thereafter, a solar cell 200 with low series resistivity and high photocurrent was obtained.

The voltage of the open-circuit, density of short-circuit, fill factor and the conversion efficiency of the solar cell 200 obtained according to this invention and the conventional solar cell 100 were tested by ASTM E892-87 (AM global 1.5, 1000 W/m$^2$). The results are recorded in Table 1.

TABLE 1

|  | Solar cell 200 | Solar cell 100 |
| --- | --- | --- |
| Voltage of open circuit | 0.596 V | 0.58 V |
| Current density of short circuit | 32.5 mA/cm$^2$ | 30 mA/cm$^2$ |
| Fill factor | 80% | 76% |
| Conversion efficiency | 15.5% | 14% |

As shown in Table 1, the voltage of open circuit, current density of short circuit, fill factor and the conversion efficiency of the solar cell 200 according this invention are larger than those of the conventional solar cell 100, indicating that the solar cell 200 fabricated by this invention has better conversion efficiency and lower series resistivity than the solar cell 100 obtained by the conventional method. Therefore, the solar cell 200 has larger photocurrent than that of the conventional solar cell 100.

It is noted that the solar cell described above consists of a P-type silicon wafer and a N-type diffusion region comprising of a shallow $N^-$ diffusion region and a deep $N^+$ diffusion region and electrodes. Alternatively, a solar cell consisting of a N-type silicon wafer and a P-type diffusion region comprising of a shallow $P^-$ diffusion region and a deep $P^+$ diffusion region and electrodes can also be fabricated according to this invention.

It is to be understood that while the invention has been described in conjunction with the detailed description thereof, that the foregoing description is intended to illustrate and not limit the scope of the invention, which is defined by the scope of the appended claims. Other aspects, advantages, and modifications are within the scope of the following claims.

What is claimed is:

1. A method for fabricating solar cells, comprising the steps of:
    (a) providing a P-substrate with a first surface and a second surface;
    (b) applying a treatment to the first surface of the P-substrate to form a rough surface;
    (c) selectively coating an $N^+$ diffusion source onto the first surface of the P-substrate;
    (d) providing an $N^-$ diffusion source and diffusing together with the $N^+$ diffusion source into the first surface of the P-substrate to form an $N^-$ type diffusion region consisting of an $N^-$ diffusion region with a shallow junction and an $N^+$ diffusion region with a deep junction;
    (e) removing the $N^+$ diffusion source overlying the first surface of the P-substrate;
    (f) forming an anti-reflection layer on the first surface;
    (g) forming a first electrode on the anti-reflection layer and a second electrode on the second surface of the P-substrate, wherein the first electrode is aligned to the $N^+$ diffusion region; and
    (h) sintering to make the first electrode pass through the anti-reflection layer and contact the $N^+$ diffusion region.

2. The method as claimed in claim 1, wherein the step (b) is performed by washing or etching with an acidic or basic solvent.

3. The method as claimed in claim 1, wherein the $N^+$ diffusion source consists of a phosphorus paste.

4. The method as claimed in claim 1, wherein the $N^+$ diffusion source is coated onto the first surface of the P-substrate by means of screen-printing, masking or photolithography.

5. The method as claimed in claim 1, wherein the $N^+$ diffusion source consists of phosphorous or arsenic composition.

6. The method as claimed in claim 1, wherein the step (d) is performed by means of high-temperature diffusion.

7. The method as claimed in claim 1, wherein the concentration of the impurity within the $N^+$ diffusion region is larger than $10^{20}$ atoms/cm$^3$.

8. The method as claimed in claim 1, wherein the concentration of the impurity within the $N^-$ diffusion region ranges from $10^{17}$ to $10^{19}$ atoms/cm$^3$.

9. The method as claimed in claim 1, wherein the step (e) is performed by using HF aqueous solution to remove the $N^+$ diffusion source.

10. The method as claimed in claim 1, wherein the anti-reflection layer consists of titanium oxide, tantalum oxide or titanium nitride.

11. The method as claimed in claim 10, wherein the anti-reflection layer is formed by means of evaporation or vapor deposition.

12. The method as claimed in claim 11, wherein the first and second electrodes consist of a conductive paste.

13. The method as claimed in claim 12, wherein the conductive paste is selected from one of the group consisting of silver paste, aluminum paste, titanium paste and platinum paste.

14. The method as claimed in claim 12, wherein the depositing of the first and second electrodes is performed be means of screen-printing.

15. The method as claimed in claim 1, wherein the step (h) is performed in an IR-furnace.

16. The method as claimed in claim 15, wherein the sintering is performed at a temperature ranging from 500° C. to 1200° C. for 0.1~2 min.

17. The method as claimed in claim 1, wherein the second electrode is aligned to the $N^+$ diffusion region.

18. A method for fabricating solar cells, comprising the steps of:
  (a) providing an N-substrate with a first surface and a second surface;
  (b) applying a treatment to the first surface of the N-substrate to form a rough surface;
  (c) selectively coating a $P^+$ diffusion source onto the first surface of the N-substrate;
  (d) providing a $P^-$ diffusion source and diffusion together with the $P^+$ diffusion source into the first surface of the N-substrate to form a P-type diffusion region consisting of a P-diffusion region with a shallow junction and a $P^+$ diffusion region with a deep junction;
  (e) removing the $P^+$ diffusion source overlying the first surface of the N-substrate;
  (f) forming an anti-reflection layer on the first surface;
  (g) forming a first electrode on the anti-reflection layer and a second electrode on the second surface of the N-substrate, wherein the first electrode is aligned to the $P^+$ diffusion region; and
  (h) sintering to make the first electrode pass through the anti-reflection layer and contact the $P^+$ diffusion region.

19. The method as claimed in claim 18, wherein the step (b) is performed by washing or etching with an acidic or basic solvent.

20. The method as claimed in claim 18, wherein the $P^+$ diffusion source consists of a boron or aluminum paste.

21. The method as claimed in claim 18, wherein the $P^+$ diffusion source is coated onto the first surface of the N-substrate by means of screen-printing, masking or photolithography.

22. The method as claimed in claim 18, wherein the $P^-$ diffusion source consists of boron or aluminum composition.

23. The method as claimed in claim 18, wherein the step (d) is performed by means of high-temperature diffusion.

24. The method as claimed in claim 18, wherein the concentration of the impurity within the $P^+$ diffusion region is larger than $10^{20}$ atoms/cm$^3$.

25. The method as claimed in claim 18, wherein the concentration of the impurity within the $P^-$ diffusion region ranges from $10^{17}$ to $10^{19}$ atoms/cm$^3$.

26. The method as claimed in claim 18, wherein the step (e) is performed by using HF aqueous solution to remove the $P^+$ diffusion source.

27. The method as claimed in claim 18, wherein the anti-reflection layer consists of titanium oxide, tantalum oxide or titanium nitride.

28. The method as claimed in claim 27, wherein the anti-reflection layer is formed by means of evaporation or vapor deposition.

29. The method as claimed in claim 18, wherein the first and second electrodes consist of a conductive paste.

30. The method as claimed in claim 29, wherein the conductive paste is selected from one of the group consisting of silver paste, aluminum paste, titanium paste and platinum paste.

31. The method as claimed in claim 29, wherein the depositing of the first and second electrodes is performed be means of screen-printing.

32. The method as claimed in claim 19, wherein the step (h) is performed in an IR-furnace.

33. The method as claimed in claim 32, wherein the sintering is performed at a temperature ranging from 500° C. to 1200° C. for 0.1~2 min.

34. The method as claimed in claim 18, wherein the second electrode is aligned to the $P^+$ diffusion region.

* * * * *